US009159711B2

(12) United States Patent
Topaloglu

(10) Patent No.: US 9,159,711 B2
(45) Date of Patent: Oct. 13, 2015

(54) INTEGRATED CIRCUIT SYSTEMS INCLUDING VERTICAL INDUCTORS

(75) Inventor: Rasit O. Topaloglu, Santa Clara, CA (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 503 days.

(21) Appl. No.: 13/194,695

(22) Filed: Jul. 29, 2011

(65) Prior Publication Data

US 2013/0027127 A1 Jan. 31, 2013

(51) Int. Cl.

*H05K 1/00* (2006.01)
*H01F 5/00* (2006.01)
*H01F 27/28* (2006.01)
*H01L 25/16* (2006.01)
*H01L 23/66* (2006.01)

(52) U.S. Cl.

CPC .............. *H01L 25/162* (2013.01); *H01L 23/66* (2013.01); *H01L 25/16* (2013.01)

(58) Field of Classification Search

CPC ... H01F 5/00; H01F 17/0006; H01F 17/0013; H01F 17/0033; H01L 23/5227; H05K 1/0233; H05K 1/0298

USPC ................... 174/250; 336/200, 223, 232, 214

See application file for complete search history.

(56) References Cited

U.S. PATENT DOCUMENTS 3,881,244 A * 5/1975 Kendall ........................ 336/200
5,929,729 A * 7/1999 Swarup ........................ 333/246
6,037,649 A * 3/2000 Liou ............................ 257/531
6,489,663 B2 * 12/2002 Ballantine et al. ............ 336/200
6,567,703 B1 * 5/2003 Thompson et al. ............. 607/60
6,800,533 B1 * 10/2004 Yeo et al. ...................... 336/223
6,975,199 B2 * 12/2005 Long et al. .................... 336/200
7,796,006 B2 * 9/2010 Chen et al. .................... 336/200
7,884,697 B2 * 2/2011 Wei et al. ...................... 336/200
8,143,952 B2 * 3/2012 Kim et al. ..................... 336/200
8,339,233 B2 * 12/2012 Tsai et al. ..................... 336/200
2005/0099259 A1 * 5/2005 Harris et al. .................. 336/200
2007/0268105 A1 * 11/2007 Walls ........................... 336/200
2008/0164967 A1 * 7/2008 Mashino ....................... 336/180
2010/0026443 A1 * 2/2010 Yan et al. ...................... 336/234

OTHER PUBLICATIONS

Definition of "portion" from www.merriam-webster.com, May 13, 2015.*

* cited by examiner

*Primary Examiner* — Chau N Nguyen
*Assistant Examiner* — Roshn Varghese
(74) *Attorney, Agent, or Firm* — Ingrassia Fisher & Lorenz, P.C.

(57) ABSTRACT

An integrated circuit system is provided that includes a circuit function in and on a surface of a semiconductor substrate. First and second portions of an inductor overlie the surface of the semiconductor substrate and each is coupled to the first circuit function. A third portion of the inductor is positioned on a second substrate. A first through substrate via (TSV) extends through the semiconductor substrate and electrically couples the first portion to the third portion and a second TSV extends through the semiconductor substrate and electrically couples the second portion to the third portion.

11 Claims, 9 Drawing Sheets

100
102
108
126
116
112
114
122
110
106
124
120
118
104

122
112
106
110
118
120
108
512
506
510
514
516
518
500
102
104

700
102
108
710
724
720
726
706
732
730
722
728
718
104

INTEGRATED CIRCUIT SYSTEMS INCLUDING VERTICAL INDUCTORS

TECHNICAL FIELD

The present invention generally relates to integrated circuit systems, and more particularly relates to integrated circuit systems that include a vertical inductor.

BACKGROUND

Integrated circuits (ICs), especially analog or linear circuits such as phase lock loop circuits or voltage controlled oscillators, as well as radio frequency (RF) circuits often include an inductor. Such circuits are often combined with other circuits such as microprocessors to form an integrated circuit system. The various circuits may each be realized as a separate semiconductor chip or die, and as such may be combined on a circuit board, in either a planar or stacked array, to form the integrated circuit system.

Inductors having a high quality factor ("Q") have been difficult to achieve in an integrated form on an IC, especially in view of the trend toward including more and more complexity on the IC. The quality factor of an inductor is the ratio of its inductive reactance to its resistance at a given frequency and is a measure of the efficiency of the inductor. The higher the Q factor, the closer the inductor approaches the behavior of an ideal, lossless inductor. Inductance of an inductor is proportional to loop area (the area circumscribed by the inductor) times the number of turns (the number of times the inductor circumscribes that area). Integrated inductors having a high inductance generally require a large surface area (i.e., a large loop area) on a semiconductor chip, and the need for a large surface area runs counter to the trend toward more complexity with more devices on a chip. If the inductor is fabricated as a multi-level loop to save surface area, the Q of the inductor suffers because of the high resistance of vias between metal levels combined with an increase in parasitic capacitance.

Accordingly, it is desirable to provide integrated circuit systems having high inductance, high Q inductors. In addition, it is desirable to provide integrated circuit systems that include vertical inductors realized through the use of through substrate vias (TSVs). Furthermore, other desirable features and characteristics of the present invention will become apparent from the subsequent detailed description and the appended claims, taken in conjunction with the accompanying drawings and the foregoing technical field and background.

BRIEF SUMMARY

Integrated circuit systems are provided that include an improved inductor. In accordance with one embodiment the integrated circuit system includes a circuit function in and on a surface of a semiconductor substrate. First and second portions of an inductor overlie the surface of the semiconductor substrate and each is coupled to the circuit function. A third portion of the inductor is positioned on a second substrate. A first through substrate via (TSV) extends through the semiconductor substrate and electrically couples the first portion to the third portion and a second TSV extends through the semiconductor substrate and electrically couples the second portion to the third portion.

In accordance with a further embodiment the integrated circuit system includes a circuit function in and on a surface of a semiconductor substrate. First and second portions of an inductor overlie the surface and are coupled to the circuit function. N additional inductor portions, where N is greater than 1, are each positioned on one of N additional substrates. A plurality of through substrates vias (TSVs) extend through selected ones of the N additional substrates and couple the N+2 portions to form a completed inductor loop.

In accordance with yet another embodiment the integrated circuit system again includes a circuit function fabricated in and on a surface of a semiconductor substrate. First and second inductors are coupled to the circuit function. A first inductor is positioned in a plane parallel to the surface. A second vertical inductor includes a first portion overlying the surface and a second portion positioned on a second surface and coupled to the first portion by through substrate vias.

BRIEF DESCRIPTION OF THE DRAWINGS

The present invention will hereinafter be described in conjunction with the following drawing figures, wherein like numerals denote like elements, and wherein:

FIGS. 1-3 and 5-7 are partially exploded perspective views; FIG. 4 is a cross sectional view.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
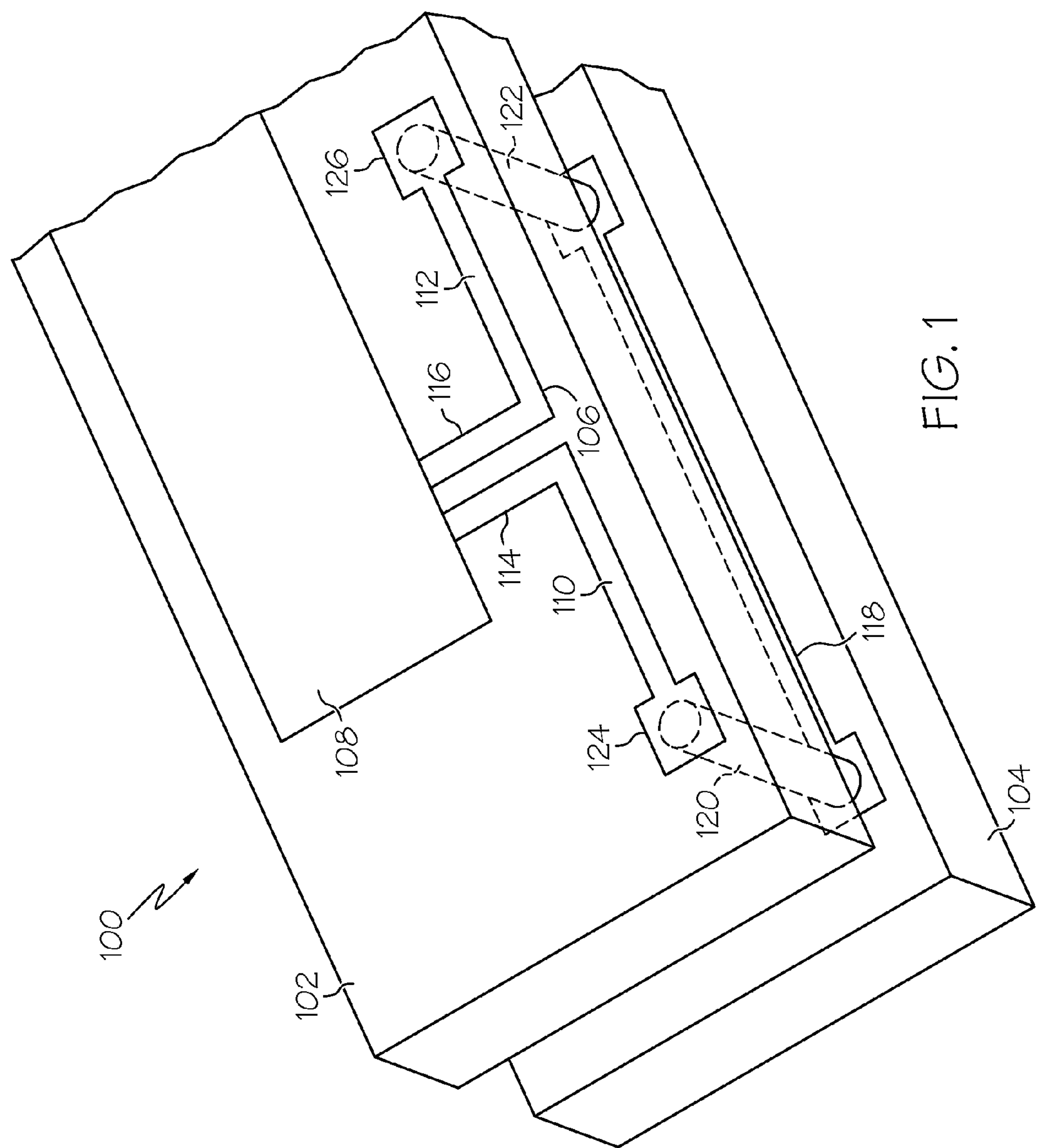
FIGS. 1-7 schematically illustrate integrated circuit systems in accordance with various embodiments.

FIG. 1 schematically illustrates, in partially exploded perspective view, an integrated circuit (IC) system 100 in accordance with one embodiment. IC system 100 includes an IC substrate 102 and a substrate 104. A vertically oriented inductor 106 is formed partially on IC substrate 102 and partially on substrate 104 as will be explained more fully below. A circuit function 108 such as an analog circuit, a sensor circuit, or a radio frequency (RF) circuit is formed in and on substrate 102. Circuit function 108 may be a part of a more comprehensive circuit that may include an MPU or other circuit or system. Substrate 104 can be another semiconductor substrate or can be a printed circuit board or interposer substrate on which one or more integrated circuit dice are mounted, perhaps with other active or passive electronic components. If substrate 104 is a semiconductor substrate, that substrate can also include a circuit function that is coupled to interact with circuit function 108.

Vertically oriented inductor 106 includes two portions 110 and 112 overlying IC substrate 102. Extremity 114 of portion 110 and extremity 116 of portion 112 are coupled to circuit function 108. Inductor 106 also includes a portion 118 formed overlying substrate 104. Portion 118 is electrically coupled to portion 110 by through substrate via (TSV) 120 and to portion 112 by TSV 122 to form a completed inductor loop. Inductor 106 thus occupies minimal surface area overlying IC substrate 102 and can be of high Q because, as explained below, TSVs 120 and 122 are low resistance. The ends of inductor portions 110 and 112 include large interconnect areas 124 and 126 to land on the TSVs. Although portions 110 and 112 have been illustrated as being of substantially the same length with their extremities 114 and 116 located substantially midway along the edge of the substrate, the portions do not have to be symmetric; one of the portions could be longer than the other and one could even be of substantially zero length. The through substrate vias are conductive channels that are formed to extend completely through the thickness of substrate 102. Such TSVs often find application in interconnecting three dimensional systems that stack multiple substrates to form an integrated system.

Figure 2:
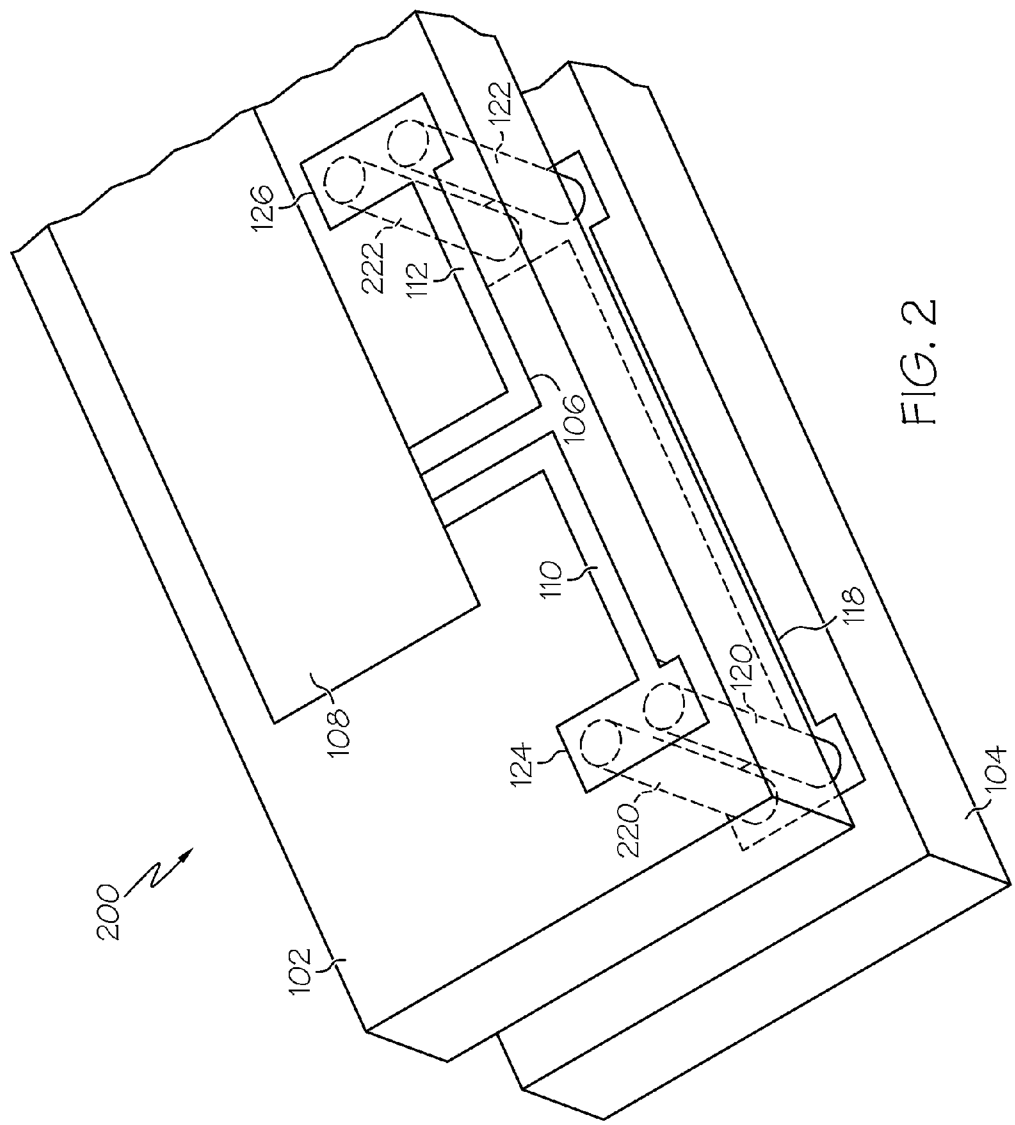

A further embodiment of an IC system 200 is illustrated in FIG. 2. IC system 200 is similar to IC system 100 except that multiple TSVs 220 and 222 in parallel with TSVs 120 and 122, respectively, are used to interconnect portion 118 of inductor 106 to portions 110 and 112. The additional TSVs help to reduce the resistance of the inductor and to thus increase the Q of the inductor. Only two additional TSVs are illustrated in FIG. 2, but any number can be used as needed to achieve the desired Q. Large interconnect areas 124 and 126 and the position of the additional TSVs are adapted so as not to reduce the length of vertical inductor 106.

Figure 3:
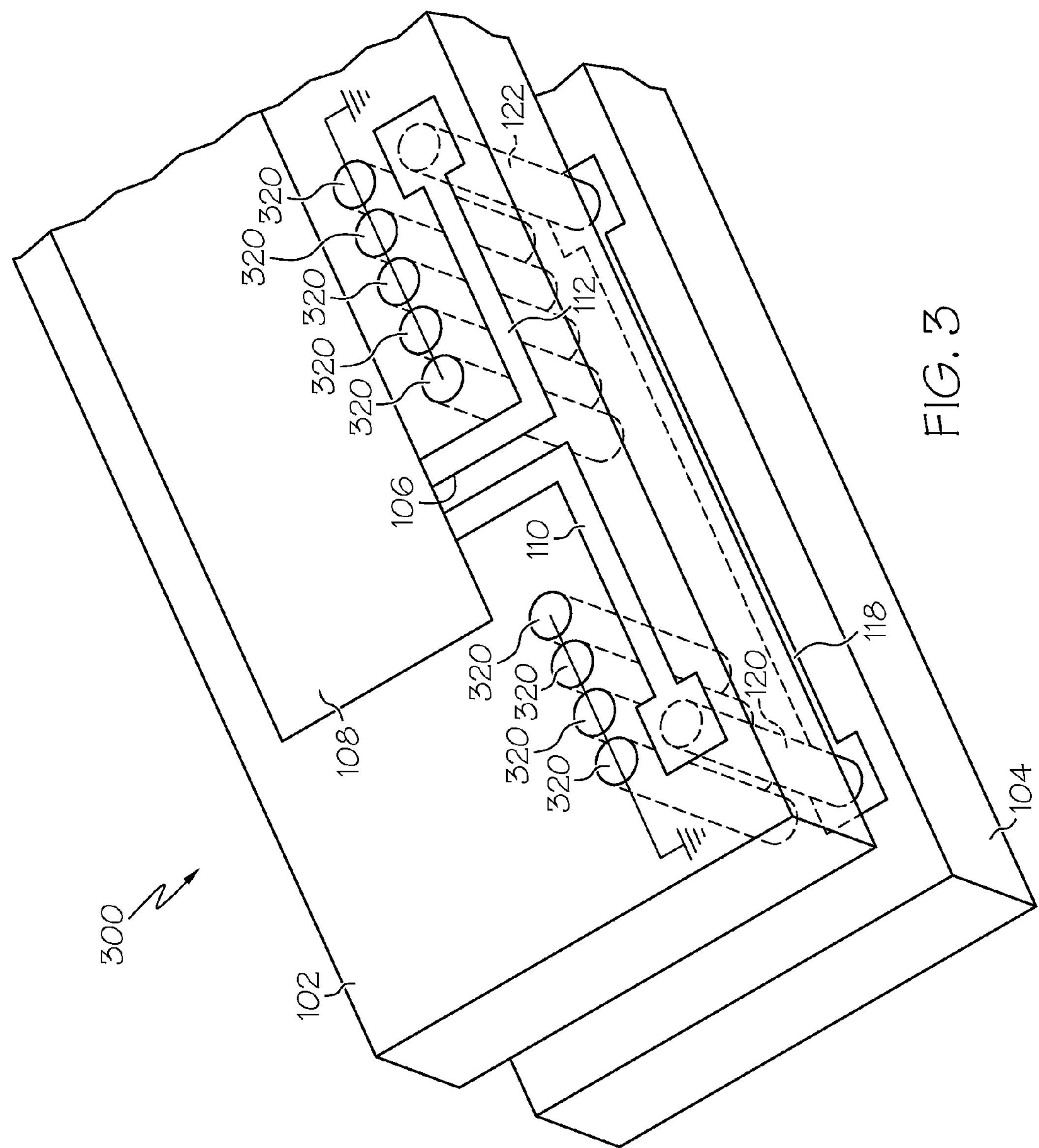

Yet another embodiment of an IC system 300 is illustrated in FIG. 3. IC system 300 is similar to IC system 100 except that a plurality of additional TSVs 320 is spaced apart from and positioned between inductor 106 and circuit function 108. The additional TSVs can be coupled to ground to form an RF shield between inductor 106 and circuit function 108. The additional TSVs serve to shield circuit function 108 from magnetic fields generated by inductor 106 and thus also serve to increase the Q of the inductor. Although not illustrated, IC system 300 can also incorporate the multiple TSVs 220, 222 as illustrated in FIG. 2.

Figure 4:
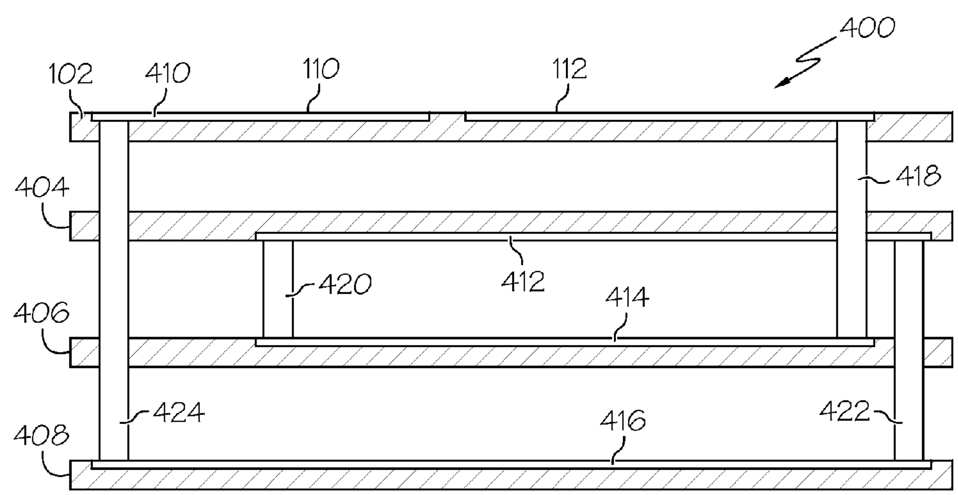

A further embodiment of an IC system 400 is schematically illustrated in cross section in FIG. 4. As with IC system 100, IC system 400 includes an IC substrate 102 in and on which a circuit function 108 (not visible in this view) is formed. IC system 400 also includes a plurality of additional substrates 404, 406, and 408. The number of additional substrates (N, where N is greater than 1) depends on the IC system being implemented. For sake of illustration only, N in this embodiment is illustrated to be 3. The additional substrates can be additional semiconductor substrates and/or circuit boards or interposer substrates which can have semiconductor dice or other circuit elements mounted thereon. If one or more of the additional substrates is a semiconductor substrate, that substrate can also include a circuit function (not illustrated in this view) that can be functionally coupled to circuit function 108. A vertically oriented inductor 410 includes two portions 110 and 112 overlying substrate 102 and N additional inductor portions 412, 414, and 416, each of the N additional inductor portions positioned on a front surface of one of the N additional substrates. Inductor portions 110 and 112 are coupled to circuit function 108. A plurality of TSVs 418, 420, 422, 424 couple the N+2 inductor portions to form an inductor loop completing inductor 410. Inductor portion 110 is coupled to inductor portion 416 by TSV 424 that passes through substrates 102, 404, and 406. Inductor portion 416, in turn, is coupled to inductor portion 412 by TSV 422 that passes through substrate 406. Inductor portion 412 is coupled to inductor portion 414 by TSV 420, and inductor portion 414 is coupled to inductor portion 112 by TSV 418 that passes through substrates 404 and 102. Some of the inductor portions are thus coupled together by a through substrate via that passes through at least one intermediate substrate. Generically that can be expressed as an $(m-1)^{th}$ one of the N inductor portions (for example, portion 412) is coupled to an $(m+1)^{th}$ inductor portion (for example, portion 416) by a TSV (for example TSV 422) that passes through an intermediate ($m^{th}$) substrate (for example, substrate 406). Further, as illustrated, at least one of the adjacent substrate pairs (for example substrates 404 and 406) are in front to front relationship. That is, the front surfaces, the surface on which normal circuit elements are formed, of the two adjacent substrates are facing each other. Others of the adjacent substrate pairs (for example substrates 406 and 408) are in front to back relationship. That is the front surface of substrate 408 is facing the back surface of adjacent substrate 406. Substrates 102 and 404 are in back to back relationship. In general, the two or more substrates can be in any combination of front to front, front to back or back to back relationship. Although the spacing between the substrates has been illustrated as being uniform, the spacing can be varied by adjusting the length of the TSVs as needed for the system being implemented.

Figure 5:
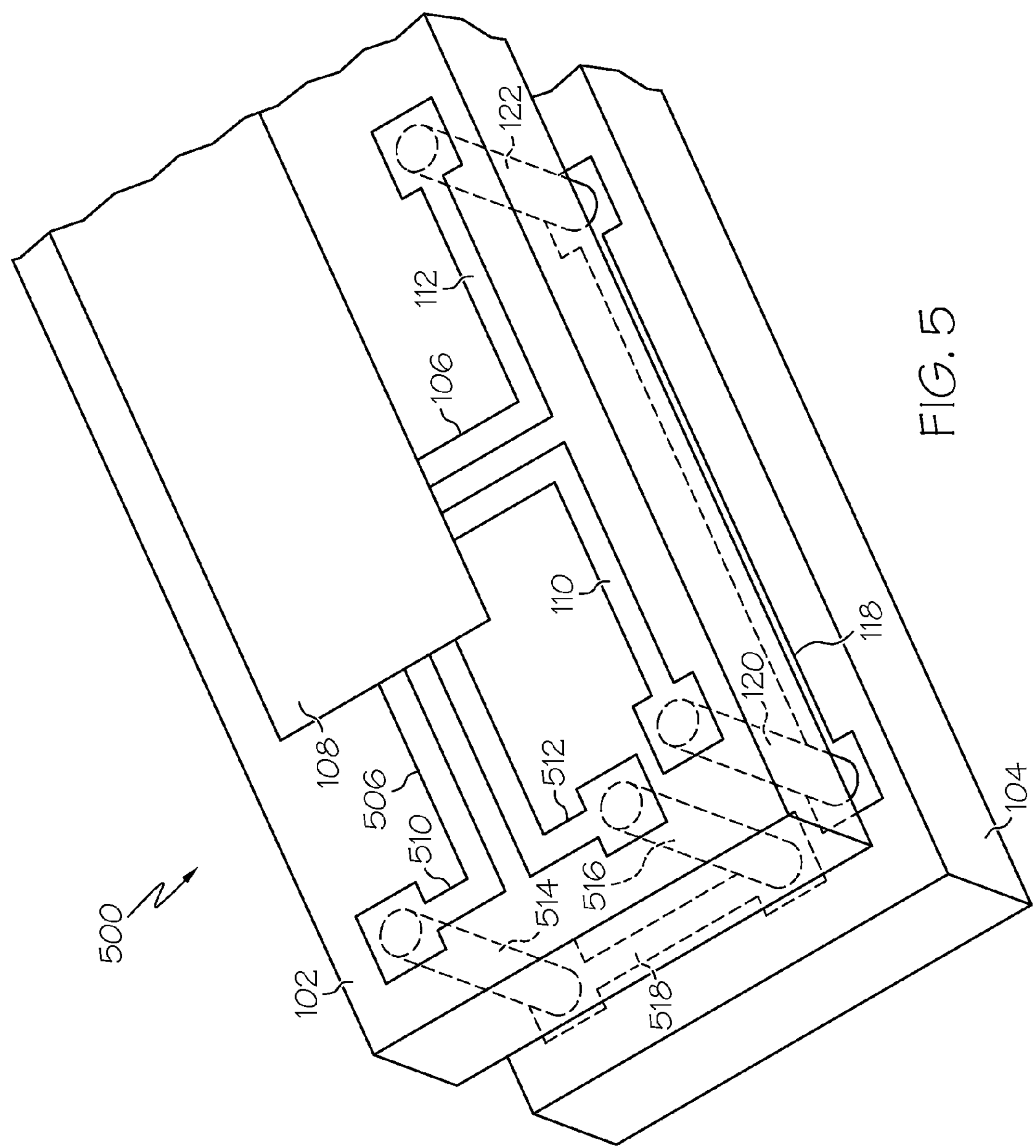

FIG. 5 schematically illustrates an IC system 500 in accordance with a further embodiment. IC system 500 is similar to IC system 100 illustrated in FIG. 1 and includes the same elements as does IC system 100. In addition, IC system 500 includes a second vertical inductor 506. Vertical inductor 506 is similar to vertical inductor 106 although the shape and dimensions need not be identical to those of inductor 106. Vertical inductor 506 includes inductor portions 510 and 512 formed overlying semiconductor substrate 102 and coupled at their extremities to circuit function 108 or to another circuit function formed in and on semiconductor substrate 102. Vertical inductor 506 also includes an inductor portion 518 formed overlying substrate 104 and coupled to portions 510 and 512 by TSVs 514 and 516, respectively. This embodiment illustrates that any number of vertical inductors needed to implement the desired integrated circuit can be incorporated into an IC system. Again, the portions of inductors 106 and 506 need not be symmetrical as they are illustrated.

Figure 6:
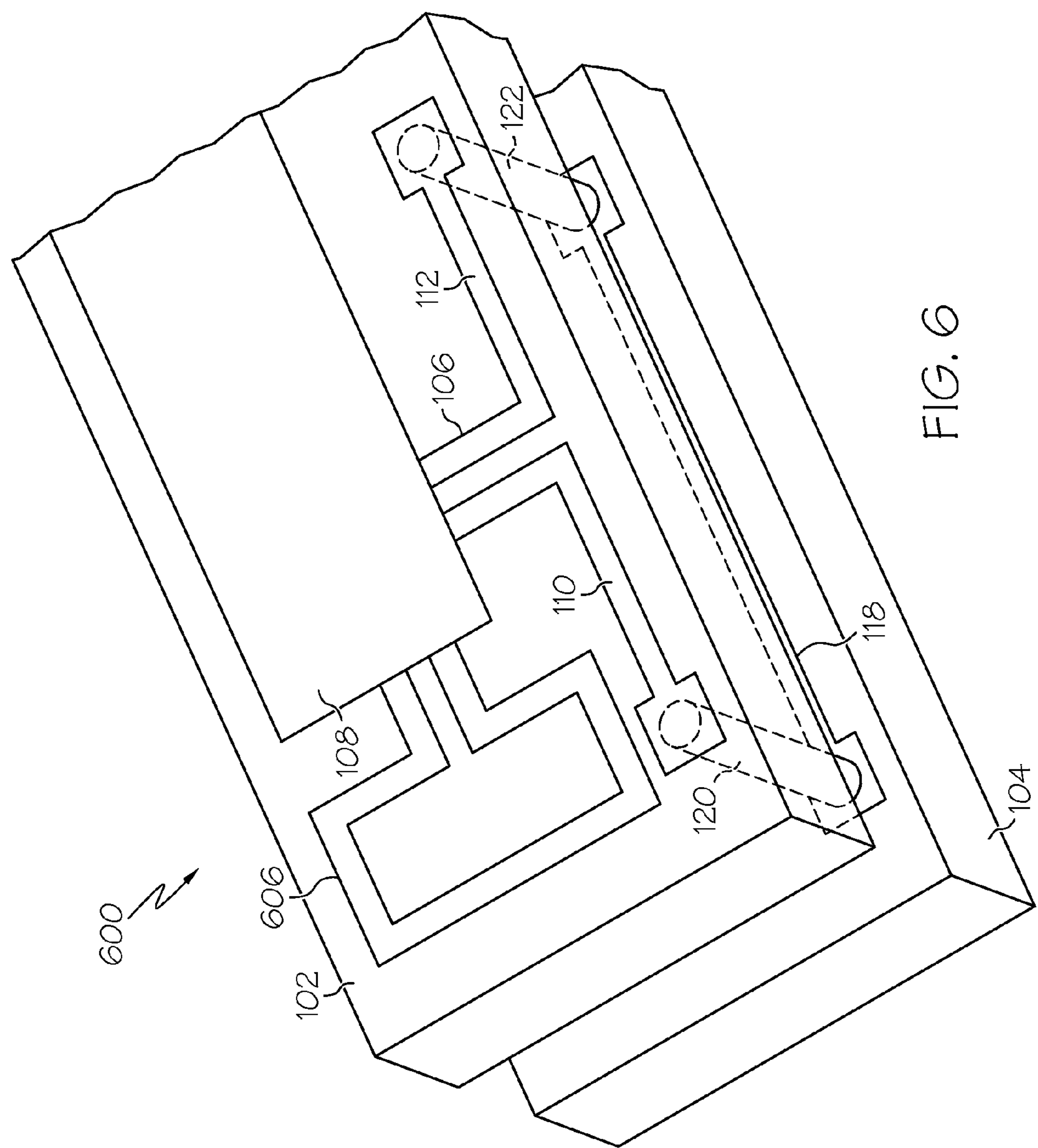

FIG. 6 schematically illustrates that conventional planar (or horizontal) inductors can be combined with vertical inductors in designing and fabricating an IC system 600 in accordance with further embodiments. IC system 600 is similar to IC system 100 illustrated in FIG. 1 and includes a vertical inductor 106 coupled to a circuit function 108 and having a portion formed overlying IC substrate 102 and another portion formed overlying a surface parallel to the front surface of IC substrate 102. The surface can be the surface of a second substrate 104 physically coupled to IC substrate 102 or can be the back surface of IC substrate 102. IC system 600 also includes a conventional horizontal inductor 606, also coupled to circuit function 108 or to another circuit function formed in and on semiconductor substrate 102. Inductor 606 is illustrated as a single loop inductor formed in the plane of the surface of substrate 102, but could be formed in several loops utilizing two or more of the metal levels used in fabricating IC function 108 and using conventional metal-to-metal vias. The use of two inductors, one vertical and one horizontal finds application in systems such as bio-medical sensor systems. For example, IC system 600 can be a bio-medical sensor system intended for use within a human or other body. Circuit function 108 can include an RF sensor designed to measure some bodily function and to communicate data related to that bodily function to a receiver outside the body. If inductors of only one orientation are included in the IC system, the transmission capability of the system is directionally limited. Reception of a signal transmitted from within the body may depend on the orientation of the system within the body. By using both vertically and horizontally positioned inductors, however, the transmission capability to an outside receiver becomes more nearly omnidirectional.

Figure 7:
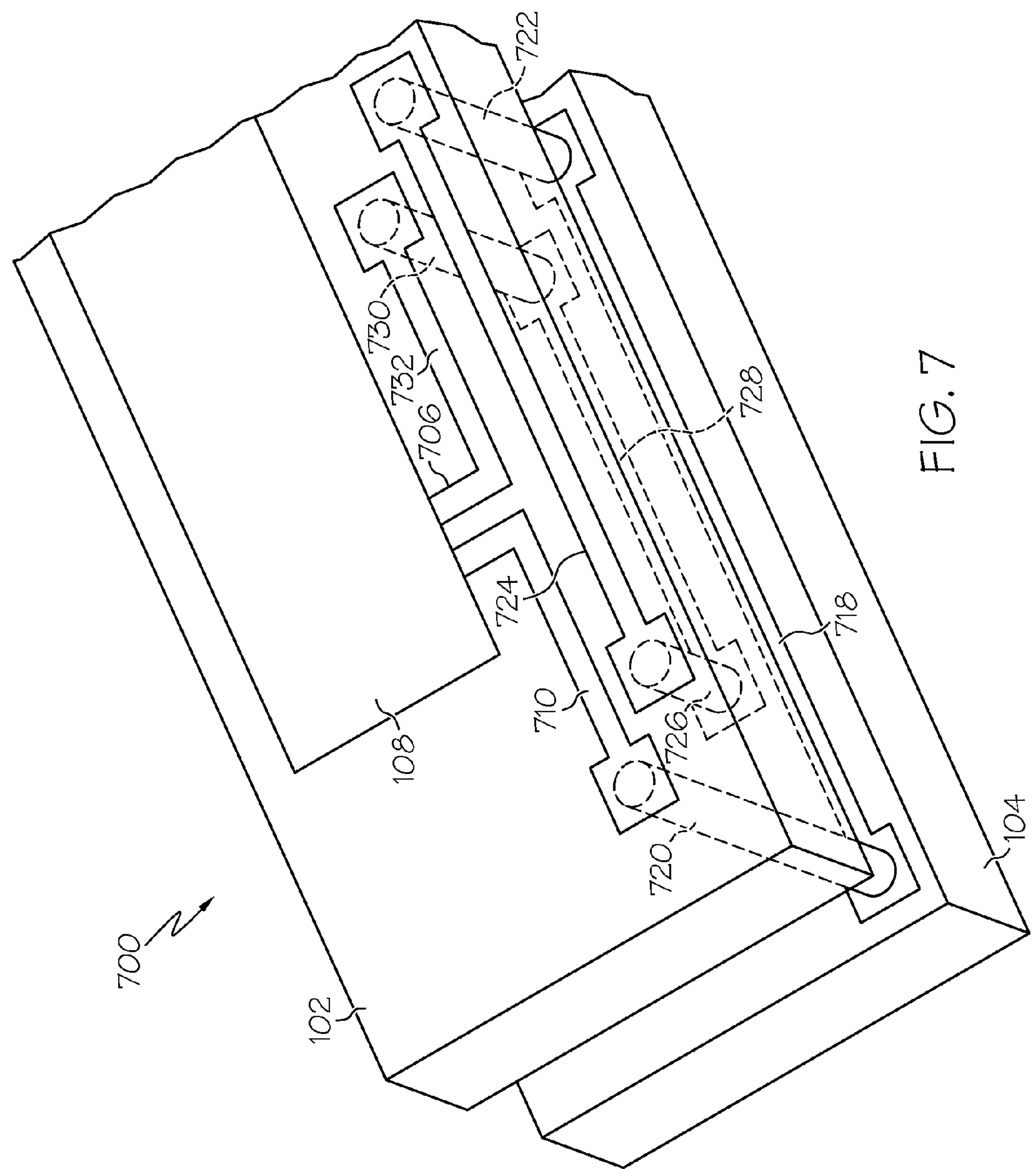

FIG. 7 schematically illustrates an IC system 700 in accordance with another embodiment in which the inductance of a vertical inductor is increased. IC system 700 is similar to IC system 100 illustrated in FIG. 1 and includes an IC substrate IC 102 having a circuit function 108 fabricated therein and thereon. A vertical inductor 706 is coupled to circuit function 108. Vertical inductor 706 includes a portion 710 formed overlying substrate 102 and coupled to the circuit function. Portion 710 is coupled through TSV 720 to a portion 718 of the inductor formed overlying a substrate 704. Portion 718 is coupled through TSV 722 to a portion 724 also located overlying IC substrate 102. Portion 724 is coupled through TSV 726 to a portion 728 formed overlying substrate 704, and portion 728 is coupled through TSV 730 to a portion 732 formed overlying IC substrate 102 and coupled to circuit function 108. The inductance of a vertical inductor can be increased by forming two or more vertical loops (only two loops are illustrated) with the various inductor portions formed overlying two vertically stacked substrates and coupled by through substrate vias.

FIGS. 8-12 schematically illustrate, in cross section, process steps for fabricating an IC system 800 in accordance with any of the foregoing embodiments. Various steps in the manufacture of ICs and IC systems are well known to those of skill in the art and so, in the interest of brevity, many conventional steps will only be mentioned briefly herein or will be omitted entirely without providing the well known process details.

Figure 8:
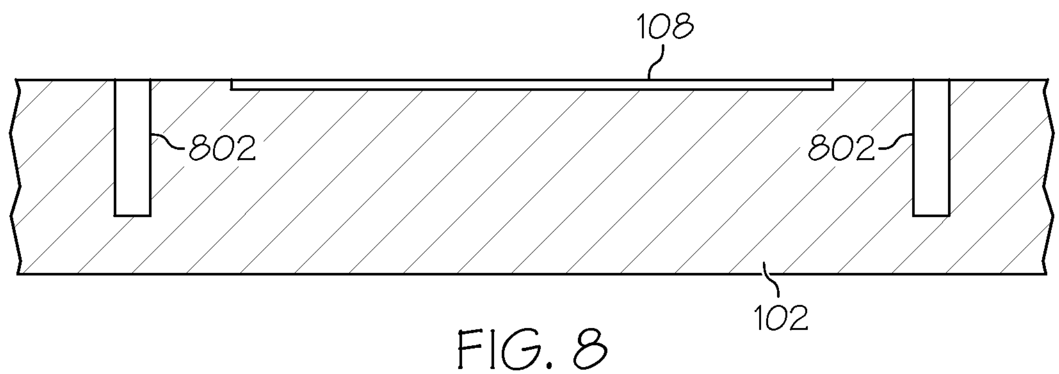
FIGS. 8-12 illustrate schematically, in cross sectional views, methods for fabricating integrated circuit systems.

Through substrate vias (TSVs) can be fabricated at various stages in the overall fabrication of an IC, and are typically fabricated either before any metal layers are formed, after first metal, or after all metal layers are formed. As illustrated in FIG. 8, a circuit function 108 (simply indicated by a rectangle) is formed in and on a semiconductor substrate 102 in conventional manner, including, in accordance with one embodiment, the formation of first layer metal contacting various impurity doped regions in the substrate. The circuit function can include, for example, a sensor portion and/or a communication portion. The communication portion can be configured to receive data from the sensor portion and to transmit signals responsive to that data. The circuit function can also include an analog portion and other rf portions other than the communication portion as well as digital circuitry.

After forming the first layer of metal, holes 802 are etched into the surface of the substrate using photolithography and etch techniques. The holes can be etched, for example, to a depth of 50-75 microns (μm). Although only two holes are illustrated, any number of holes can be etched as is needed to implement the IC system. The holes and the resulting TSVs can have different cross sectional areas depending on the desired resistance of the TSV. Holes 802 can have, for example, an effective diameter of about 1-20 micrometers (μm).

Figure 9:
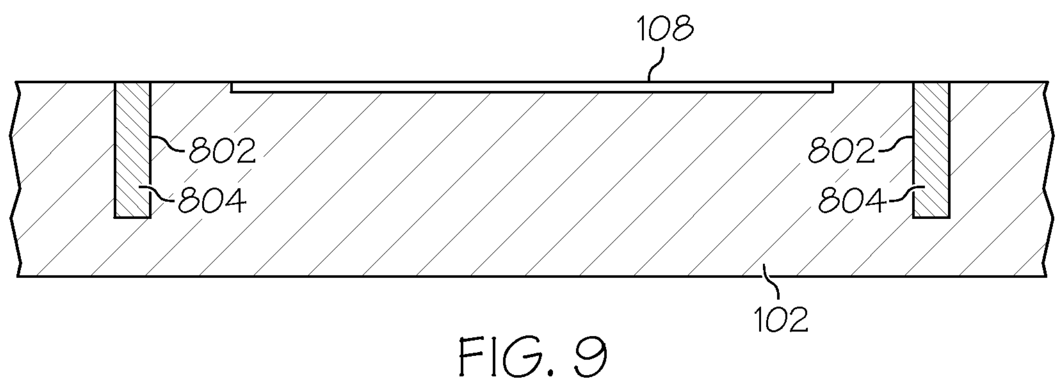

As illustrated in FIG. 9, holes 802 are filled with copper or other conductive material 804. As is well known, the process of filling the holes may include forming an isolation layer, a barrier layer, a seed layer, and then plating copper. Any copper plated over the surface of substrate 102 is removed, for example by chemical mechanical polishing (CMP).

Figure 10:
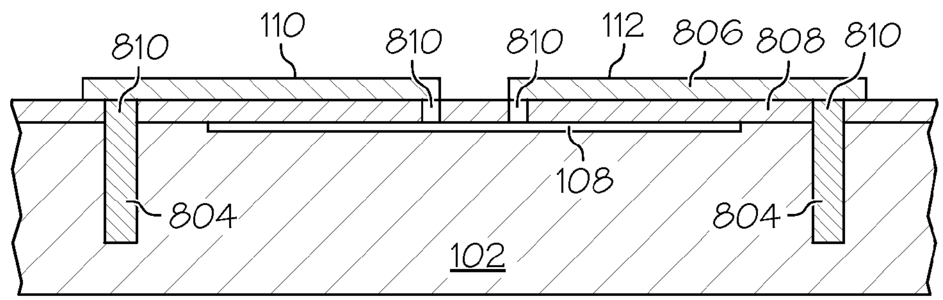

The process continues as illustrated in FIG. 10 by completing the back-end-of-line (BEOL) steps. These steps include completing the metallization of the IC which typically includes multiple metal layers separated by insulating layers. One of the metal layers includes the portions 110, 112 of vertical inductor 806 that overlies IC substrate 102 and an insulating layer 808. The ends of the portions of inductor 806 are electrically coupled to the copper 804 in holes 802 and to circuit function 108 by metal plugs 810. Although not illustrated, in accordance with one embodiment a final insulating passivation layer is applied overlying the substrate and solder bumps are applied to bonding pads exposed through the passivation layer.

Figure 11:
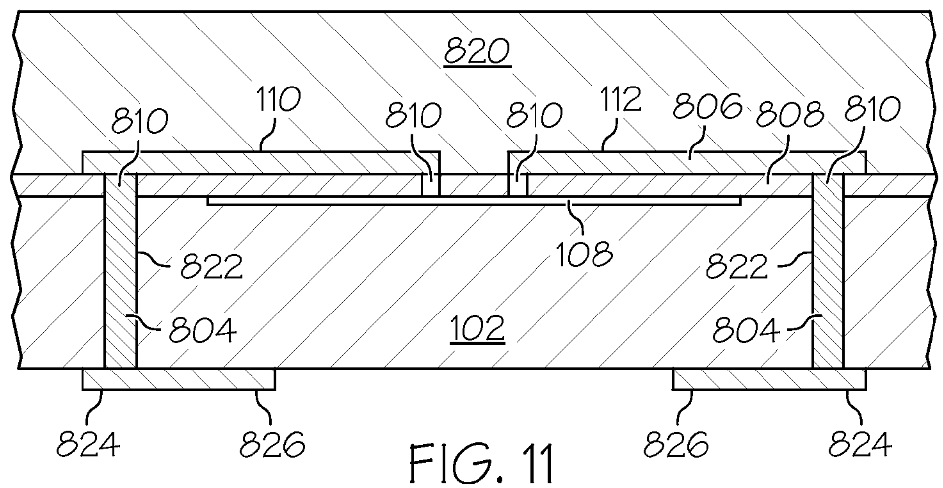

After forming the passivation layer and solder bumps, the front surface of IC substrate 102 is temporarily bonded to a temporary wafer carrier 820 as illustrated in FIG. 11. IC substrate 102 is thinned, for example by CMP, to expose a portion of copper 804. The copper thus extends through the entire remaining thickness of IC substrate 102 and forms through substrate vias 822. Although not illustrated, the back surface of IC substrate 102 may be further thinned, without etching the copper TSVs to cause the TSVs to extend above the thinned back surface. In accordance with one embodiment a layer of copper or other metal is deposited on the thinned back surface of the substrate. The layer of metal is patterned to form a redistribution layer 824 in contact with TSVs 822. The redistribution layer provides a desired pattern of bonding pads 826 on the back surface of the substrate. TSVs 822 are filled with copper or other highly conductive material, have a length of 50-75 μm and a diameter of about 1-20 μm. As such the TSVs have a resistance of less than about 1 Ohm, and the low resistance contributes to the implementation of a high Q inductor.

Figure 12:
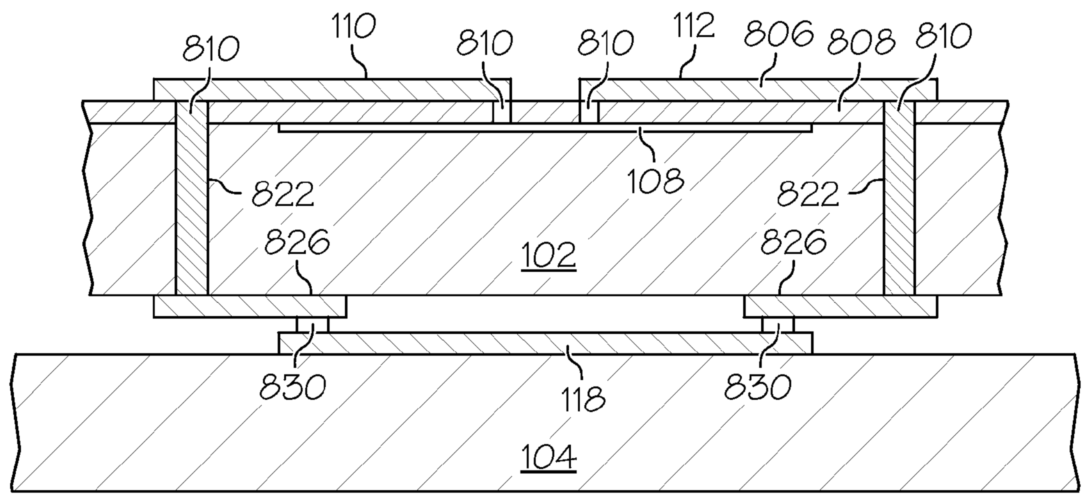

As illustrated in FIG. 12, temporary wafer carrier 820 is removed and the thinned IC substrate 102 is attached to a substrate 104. Substrate 104 can be another semiconductor die or can be a circuit board or interposer substrate upon which other semiconductor dice or electrical elements are mounted. Substrate 104 includes solder balls 830 or other means for coupling the elements on substrate 104 to bonding pads 826 on the back surface of IC substrate 102. The elements on substrate 104 include portion 118 of vertical inductor 806 that, together with portions 110 and 112 and TSVs 822, complete vertical inductor 806. An advantage of an IC system such as that illustrated is that silicon substrates such as IC substrate 102 can be coupled to chips fabricated from other semiconductor materials such as GaAs that are mounted on substrate 104. For example, a GaAs sensor chip can be coupled to and communicate with a data processing circuit element on IC substrate 102. The data processing circuit can receive data from the sensor chip, process that data and convey processed data to a transmission circuit either on IC substrate 102 or on substrate 104 for transmission from the IC system.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiments. Although a limited number of embodiments have been described and illustrated to show how they could be combined, it is feasible that any of the various embodiments could be combined as needed to meet the requirements of the integrated circuit system being implemented. It should be understood that various changes can be made in the function and arrangement of elements without departing from the scope of the invention as set forth in the appended claims and the legal equivalents thereof.

What is claimed is:

1. An integrated circuit system comprising: a first circuit function on a surface of a semiconductor substrate; a first portion and a second portion of an inductor, an entirety of the first and second portions overlying the surface of the semiconductor substrate, the first and second portions being physically separated from one another on the surface of the semiconductor substrate, the first portion coupled to the circuit function; a third portion of the inductor provided as a single conductive metal line, an entirety of the third portion overlying a second substrate, a majority of each of the first and second portions directly overlying and extending parallel to the third portion; a first through substrate via extending through the semiconductor substrate and electrically and directly physically coupled to the first portion and the third portion; a second through substrate via extending through the semiconductor substrate and electrically and directly physically coupled to the second portion and the third portion, wherein an entirety of the third portion is provided as the single conductive metal line and extends from the first through substrate via to the second through substrate via; and wherein the first portion is coupled to and is in direct, physical connection with the circuit function, wherein the second portion is coupled to and is in direct, physical connection with the circuit function and wherein a minority of each of the first and second portions are offset from the third portion and extend perpendicularly to the third portion.

2. The integrated circuit system of claim 1 further comprising a plurality of through substrate vias spaced apart from and positioned between the first circuit function and the first portion and the second portion and configured to be coupled to ground.

3. The integrated circuit system of claim 1 wherein the second substrate comprises a second semiconductor substrate and wherein the second semiconductor substrate includes a second circuit function.

4. The integrated circuit system of claim 1 further comprising: a third through substrate via electrically coupled to the first portion and the third portion; and a fourth through substrate via electrically coupled to the second portion and the third portion.

5. The integrated circuit system of claim 1 wherein the second substrate comprises an interposer substrate having a plurality of semiconductor die mounted thereon.

6. The integrated circuit system of claim 1 wherein the first through substrate via and the second through substrate via extend through the semiconductor substrate from the surface to a back surface, the integrated circuit system further comprising a redistribution layer positioned overlying the back surface.

7. The integrated circuit system of claim 1 further comprising a second inductor comprising: a fourth portion on the surface of the semiconductor substrate and coupled to the circuit function; a fifth portion positioned on the second substrate; and a plurality of through substrate vias coupling the fourth portion to the fifth portion to form an inductor loop.

8. The integrated circuit system of claim 1 wherein each of the first portion, second portion, third portion, first through substrate via and second through substrate via comprise copper.

9. The integrated circuit system of claim 1 further comprising: a fourth portion of the inductor overlying the second substrate and a fifth portion of the inductor overlying the semiconductor substrate, the fifth portion coupled to the circuit function; a third through substrate via extending through the semiconductor substrate and electrically coupled to the second portion and the fourth portion; and a fourth through substrate via extending through the semiconductor substrate and electrically coupled to the fourth portion and the fifth portion.

10. The integrated circuit system of claim 1, wherein the minority portion of each of the first and second portions provides the coupling with and the direct, physical connection with the circuit function.

11. The integrated circuit system of claim 10, wherein each of the first and second portions comprise conductive metal lines, wherein a first end of the first portion is in direct, physical contact with the circuit function and a second end of the first portion is in direct, physical contact with the first through substrate via such that the first portion is not in direct, physical contact with the second through substrate via, and wherein a first end of the second portion is in direct, physical contact with the circuit traction and a second end of the second portion is in direct, physical contact with the second through substrate via such that the second portion is not in direct, physical contact with the first through substrate via.

* * * * *